US012336386B2

(12) United States Patent
Meng et al.

(10) Patent No.: US 12,336,386 B2
(45) Date of Patent: Jun. 17, 2025

(54) DISPLAY SUBSTRATE AND MANUFACTURING METHOD THEREOF, AND DISPLAY DEVICE

(71) Applicant: BOE Technology Group Co., Ltd., Beijing (CN)

(72) Inventors: Qiuhua Meng, Beijing (CN); Ming Liu, Beijing (CN); Yang Yu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/608,120

(22) PCT Filed: Dec. 21, 2020

(86) PCT No.: PCT/CN2020/137943
§ 371 (c)(1),
(2) Date: Nov. 1, 2021

(87) PCT Pub. No.: WO2022/133640
PCT Pub. Date: Jun. 30, 2022

(65) Prior Publication Data
US 2023/0307466 A1     Sep. 28, 2023

(51) Int. Cl.
*H10K 59/121*   (2023.01)
*H10D 86/01*    (2025.01)
(Continued)

(52) U.S. Cl.
CPC ..... *H10K 59/1213* (2023.02); *H10D 86/0221* (2025.01); *H10D 86/423* (2025.01);
(Continued)

(58) Field of Classification Search
CPC ............ H01L 27/1248; H01L 27/1225; H01L 27/1237; H01L 27/127; H10K 59/124; H10K 59/1213
See application file for complete search history.

(56) References Cited

U.S. PATENT DOCUMENTS 10,916,185 B1   2/2021 Dai et al.
2016/0126358 A1* 5/2016 Kao .................. H01L 29/24
                                                          257/43
(Continued)

FOREIGN PATENT DOCUMENTS

CN    110366779 A    10/2019
CN    110649043 A     1/2020
(Continued)

OTHER PUBLICATIONS

Shi et al., "Structural and Optical Properties of Amorphous Al2O3 Thin Film Deposited by Atomic Layer Deposition," Advances in Condensed Matter Physics, 2018 (Year: 2018).*

*Primary Examiner* — Joseph C. Nicely
*Assistant Examiner* — Alvin L Lee
(74) *Attorney, Agent, or Firm* — IPro, PLLC

(57) ABSTRACT

The present disclosure provides a display substrate, a manufacturing method thereof, and a display device. The display substrate comprises a base substrate, and a first thin film transistor and a second thin film transistor formed on the base substrate, wherein a first active layer of the first thin film transistor is made of low-temperature polysilicon, and a second active layer of the second thin film transistor is made of a metal oxide. The display substrate further comprises a first barrier layer on a side of the second active layer close to the base substrate and a second barrier layer on a side of the second active layer away from the base substrate. The orthographic projection of the second active layer onto the base substrate falls within the orthographic projections of the first barrier layer and the second barrier layer onto the base substrate.

12 Claims, 2 Drawing Sheets

(51) Int. Cl.
*H10D 86/40* (2025.01)
*H10D 86/60* (2025.01)
*H10K 59/124* (2023.01)

(52) U.S. Cl.
CPC ......... *H10D 86/431* (2025.01); *H10D 86/451* (2025.01); *H10D 86/60* (2025.01); *H10K 59/124* (2023.02)

(56) References Cited

U.S. PATENT DOCUMENTS

| | | | |
|---|---|---|---|
| 2017/0155000 A1* | 6/2017 | Moon | H01L 27/1214 |
| 2018/0114864 A1* | 4/2018 | Liu | H01L 23/53295 |
| 2018/0277376 A1* | 9/2018 | Wang | H01L 27/1251 |
| 2018/0277614 A1 | 9/2018 | Ono et al. | |
| 2019/0140101 A1* | 5/2019 | Im | H10D 30/6758 |
| 2020/0111855 A1 | 4/2020 | Bae et al. | |
| 2020/0144309 A1* | 5/2020 | Jeon | H01L 27/1225 |
| 2020/0395425 A1 | 12/2020 | Han et al. | |
| 2022/0208806 A1* | 6/2022 | Park | H01L 27/1248 |
| 2022/0320211 A1* | 10/2022 | Zhao | H10D 86/60 |

FOREIGN PATENT DOCUMENTS

| | | | | |
|---|---|---|---|---|
| CN | 111009557 A | | 4/2020 | |
| CN | 111162090 A | | 5/2020 | |
| CN | 111863837 A | | 10/2020 | |
| KR | 20150101418 A | * | 9/2015 | ......... H10K 59/1213 |

* cited by examiner

DISPLAY SUBSTRATE AND MANUFACTURING METHOD THEREOF, AND DISPLAY DEVICE

CROSS-REFERENCE TO RELATED APPLICATION

This application is the U.S. national phase of PCT Application No. PCT/CN2020/137943 filed on Dec. 21, 2020, the disclosure of which is incorporated in its entirety by reference herein.

TECHNICAL FIELD

The present disclosure relates to the technical field of display, in particular to a display substrate and a manufacturing method thereof, and a display device.

BACKGROUND

Thin film transistors, as important switching control elements, play a critical role in display devices. In the prior art, in order to provide a display device with good picture display quality, a thin film transistor structure is generally provided in a display substrate of the display device, the thin film transistor structure comprising two types of thin film transistors, one of which has the advantages of high mobility and fast charging and the other of which has the advantage of low leakage current. For example, in an Organic Light Emitting Diode (OLED) display substrate, a thin film transistor structure is usually provided, and the thin film transistor structure comprises a first thin film transistor and a second thin film transistor, wherein the first thin film transistor is a low-temperature polycrystalline silicon thin film transistor, and the second thin film transistor is a metal oxide thin film transistor. When a display device provided with an OLED display substrate displays a picture, the OLED means in the OLED display substrate is driven using the advantages of the first thin film transistor of high mobility and fast charging and the advantages of the second thin film transistor of low leakage current, so that the display device has good picture display quality.

However, when a first thin film transistor having the advantages of high mobility and fast charging and a second thin film transistor having a low leakage current are provided simultaneously in the display substrate, the active layer of the first thin film transistor is usually doped with hydrogen (such as a low-temperature polycrystalline silicon thin film transistor), and the second thin film transistor is usually a metal oxide thin film transistor, namely, the material of the active layer of the second thin film transistor is a metal oxide. However, the metal oxide as the active layer of the second thin film transistor is very sensitive to hydrogen, and the hydrogenation process when manufacturing the display substrate may affect the characteristics of the second thin film transistor. For example, hydrogen may diffuse into the active layer of the second thin film transistor, adversely affecting the active layer of the second thin film transistor and thus adversely affecting the performance of the second thin film transistor.

SUMMARY

The technical problem to be solved by the present disclosure is to provide a display substrate, a manufacturing method thereof, and a display device, which can improve the electrical reliability of the display substrate.

In order to solve the above, the embodiments of the present disclosure provide the following technical solutions.

In one aspect, there is provided a display substrate comprising a base substrate, and a first thin film transistor and a second thin film transistor formed on the base substrate, wherein a first active layer of the first thin film transistor is made of low-temperature polysilicon, and a second active layer of the second thin film transistor is made of metal oxide. The display substrate further comprises a first barrier layer on a side of the second active layer close to the base substrate and a second barrier layer on a side of the second active layer away from the base substrate, the orthographic projection of the second active layer onto the base substrate falling within the orthographic projection of the first barrier layer onto the base substrate, and the orthographic projection of the second active layer onto the base substrate falling within the orthographic projection of the second barrier layer onto the base substrate. The orthographic projections of the electrodes of the second thin film transistor onto the base substrate all fall within the orthographic projection of the first barrier layer onto the base substrate, and the orthographic projections of the electrodes of the second thin film transistors onto the base substrate all fall within the orthographic projection of the second barrier layer onto the base substrate.

In some embodiments, the first barrier layer and/or the second barrier layer are made of a light absorbing material.

In some embodiments, the display substrate further comprises a silicon nitride layer on a side of the first barrier layer close to the base substrate; and/or a silicon nitride layer on a side of the second barrier layer away from the base substrate.

In some embodiments, the orthographic projection of the first active layer onto the base substrate at least partially overlaps the orthographic projection of the first barrier layer onto the base substrate, and the orthographic projection of the first active layer onto the base substrate at least partially overlaps the orthographic projection of the second barrier layer onto the base substrate. The orthographic projections of the electrodes of the first thin film transistor onto the base substrate at least partially overlap the orthographic projection of the first barrier layer onto the base substrate, and the orthographic projections of the electrodes of the first thin film transistor onto the base substrate at least partially overlap the orthographic projection of the second barrier layer onto the base substrate.

In some embodiments, the display substrate comprises the following provided sequentially in a direction away from the base substrate:

a first buffer layer;
the first active layer;
a first gate insulation layer of the first thin film transistor;
a first gate electrode of the first thin film transistor;
a second gate insulation layer of the first thin film transistor;
a second buffer layer;
the second active layer;
a third gate insulation layer of the second thin film transistor;
a second gate electrode of the second thin film transistor;
a first interlayer insulation layer;
a first source electrode and a first drain electrode of the first thin film transistor and a second source electrode and a second drain electrode of the second thin film transistor;
wherein the first barrier layer is located between the second buffer layer and the second gate insulation layer; the second barrier layer is located between the first interlayer insulation layer and the second gate electrode;

the first source electrode and the first drain electrode are respectively connected to the first active layer through a via hole penetrating the first gate insulation layer, the second gate insulation layer, the first barrier layer, the second buffer layer, the third gate insulation layer, the second barrier layer and the first interlayer insulation layer, and the second source electrode and the second drain electrode are respectively connected to the second active layer through a via hole penetrating the third gate insulation layer, the second barrier layer and the first interlayer insulation layer.

In some embodiments, the display substrate comprises the following provided sequentially in a direction away from the base substrate:

a first buffer layer;
the first active layer;
a first gate insulation layer of the first thin film transistor;
a first gate electrode of the first thin film transistor;
a second gate insulation layer of the first thin film transistor;
a second buffer layer;
the second active layer;
a third gate insulation layer of the second thin film transistor;
a second gate electrode of the second thin film transistor;
a first interlayer insulation layer;
a first source electrode and a first drain electrode of the first thin film transistor and a second source electrode and a second drain electrode of the second thin film transistor;
passivation layer;
a planarization layer;
wherein the first barrier layer is located between the second buffer layer and the second gate insulation layer; the second barrier layer is located between the passivation layer and the planarization layer;
the first source electrode and the first drain electrode are respectively connected to the first active layer through a via hole penetrating the first gate insulation layer, the second gate insulation layer, the first barrier layer, the second buffer layer, the third gate insulation layer and the first interlayer insulation layer, and the second source electrode and the second drain electrode are respectively connected to the second active layer through a via hole penetrating the third gate insulation layer and the first interlayer insulation layer.

In some embodiments, the display substrate comprises the following provided sequentially in a direction away from the base substrate:

a first buffer layer;
the first active layer;
a first gate insulation layer of the first thin film transistor;
a first gate electrode of the first thin film transistor;
a second buffer layer;
the second active layer;
a third gate insulation layer of the second thin film transistor;
a second gate electrode of the second thin film transistor;
a first interlayer insulation layer;
a second interlayer insulation layer;
a first source electrode and a first drain electrode of the first thin film transistor and a second source electrode and a second drain electrode of the second thin film transistor;
wherein the first barrier layer is located between the first gate electrode and the second buffer layer; the second barrier layer is located between the second gate electrode and the first interlayer insulation layer;
the first source electrode and the first drain electrode are respectively connected to the first active layer through a via hole penetrating the first gate insulation layer, the second buffer layer, the third gate insulation layer, the first interlayer insulation layer and the second interlayer insulation layer, and the second source electrode and the second drain electrode are respectively connected to the second active layer through a via hole penetrating the third gate insulation layer, the first interlayer insulation layer and the second interlayer insulation layer.

In some embodiments, the display substrate comprises the following provided sequentially in a direction away from the base substrate:

a first buffer layer;
the first active layer;
a first gate insulation layer of the first thin film transistor;
a first gate electrode of the first thin film transistor;
a second buffer layer;
the second active layer;
a third gate insulation layer of the second thin film transistor;
a second gate electrode of the second thin film transistor;
a first interlayer insulation layer;
a second interlayer insulation layer;
a first source electrode and a first drain electrode of the first thin film transistor and a second source electrode and a second drain electrode of the second thin film transistor;
wherein the first barrier layer is located between the first gate electrode and the second buffer layer; the second barrier layer is located between the second interlayer insulation layer and the first interlayer insulation layer;
the first source electrode and the first drain electrode are respectively connected to the first active layer through a via hole penetrating the first gate insulation layer, the second buffer layer, the third gate insulation layer, the first interlayer insulation layer and the second interlayer insulation layer, and the second source electrode and the second drain electrode are respectively connected to the second active layer through a via hole penetrating the third gate insulation layer, the first interlayer insulation layer and the second interlayer insulation layer.

In some embodiments, the first gate insulation layer is made of silicon oxide and the second gate insulation layer is made of silicon nitride doped with hydrogen ions.

In some embodiments, the first interlayer insulation layer is made of silicon oxide and the second interlayer insulation layer is made of a composite of silicon oxide and silicon nitride doped with hydrogen ions.

In some embodiments, the first barrier layer and the second barrier layer is made of a metal oxide.

In some embodiments, the first barrier layer and the second barrier layer is made of molybdenum oxide or molybdenum oxide added with a metal including neodymium and tantalum.

In some embodiments, the first barrier layer has a thickness of 10-100 nm, and/or the second barrier layer has a thickness of 10-100 nm.

Embodiments of the present disclosure also provide a display device which comprises the display substrate described above.

Embodiments of the present disclosure also provide a manufacturing method of a display substrate, the display substrate comprising a base substrate, and a first thin film transistor and a second thin film transistor formed on the base substrate, wherein a first active layer of the first thin film transistor is made of low-temperature polysilicon, a second active layer of the second thin film transistor is made of metal oxide, and the manufacturing method of a display substrate comprises the following steps:

a first barrier layer is formed on a side of the second active layer close to the base substrate;

a second barrier layer is formed on a side of the second active layer away from the base substrate;

wherein the orthographic projection of the second active layer onto the base substrate falls within the orthographic projection of the first barrier layer onto the base substrate, and the orthographic projection of the second active layer onto the base substrate falls within the orthographic projection of the second barrier layer onto the base substrate. The orthographic projections of the electrodes of the second thin film transistor onto the base substrate all falls within the orthographic projection of the first barrier layer onto the base substrate, and the orthographic projections of the electrodes of the second thin film transistor onto the base substrate all falls within the orthographic projection of the second barrier layer onto the base substrate.

Figure 1:
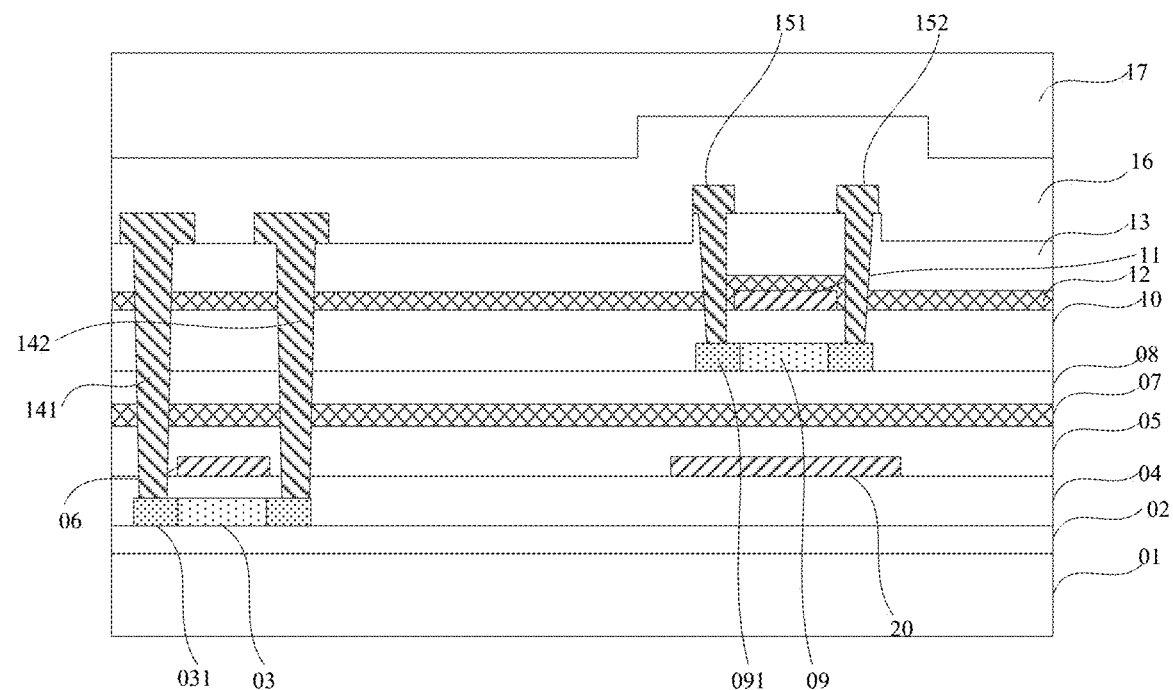
FIGS. 1-4 show schematic structural views of a display substrate according to embodiments of the present disclosure.

REFERENCE NUMERALS 01 substrate 02 first buffer layer 03 first active layer
031 a first source drain contact region 04 a first gate insulation layer 05 a second gate insulation layer
06 first gate electrode 07 first barrier layer 08 second buffer layer 09 second active layer
091 second source drain contact region 10 third gate insulation layer 11 second gate electrode 12 second barrier layer
13 first interlayer insulation layer 141 first source electrode 142 second drain electrode
151 second source electrode 152 second drain electrode
16 passivation layer 17 planarization layer
18 second interlayer insulation layer
20 bottom gate of the second thin film transistor

DETAILED DESCRIPTION

In order that the technical problems to be solved by the embodiments of the present disclosure, technical solutions, and advantages can be more clearly understood, a detailed description will be given below with reference to the accompanying drawings and specific embodiments.

Embodiments of the present disclosure provide a display substrate, a manufacturing method thereof, and a display device, which can improve electrical reliability of the display substrate.

Embodiments of the present disclosure provide a display substrate, comprising a base substrate, and a first thin film transistor and a second thin film transistor formed on the base substrate, wherein a first active layer of the first thin film transistor is made of low-temperature polysilicon, and a second active layer of the second thin film transistor is made of a metal oxide. The display substrate further comprises a first barrier layer on a side of the second active layer close to the base substrate and a second barrier layer on a side of the second active layer away from the base substrate. The orthographic projection of the second active layer onto the base substrate falls within the orthographic projection of the first barrier layer onto the base substrate, and the orthographic projection of the second active layer onto the base substrate falls within the orthographic projection of the second barrier layer onto the base substrate.

In this embodiment, barrier layers (comprising a first barrier layer and a second barrier layer) are provided on the upper and lower sides of the second active layer, wherein the barrier layers can block hydrogen ions or other ions in other film layers from diffusing into the second active layer, avoid electrical problems such as threshold voltage shift in the second active layer, improve the electrical stability of the second thin film transistor, and thus improve the electrical reliability of the display substrate.

In the film layers of the display substrate, hydrogen ions and other ions may be present in the inorganic insulation layer and the organic insulation layer, and hydrogen ions in these film layers may diffuse after the display substrate is subjected to a hydrogenation process, and the diffusion of hydrogen ions may affect the negative bias temperature stress (NBTS) characteristic of the second thin film transistor. For example, hydrogen ions may generate additional hole carriers after diffusing into the channel of the second active layer; after the hydrogen ions diffuse to the interface of the second active layer and the gate insulation layer, a defect energy level is generated, and the defect energy level functions as a hole trap at the interface; when a negative gate bias is applied, hole trapping occurs on the hole carriers at the interface of the second active layer and the gate insulation layer, partially shielding the gate electric field, and negatively biasing the threshold voltage (Vth). In order to avoid this, in the present embodiment, barrier layers (comprising a first barrier layer and a second barrier layer) are provided on the upper and lower sides of the second active layer, and the barrier layers can block hydrogen ions or other ions in other film layers from diffusing into the second active layer, ensuring the performance of the second thin film transistor.

In some embodiments, the first barrier layer and/or the second barrier layer are made of a light absorbing material, so that the first barrier layer and the second barrier layer, in addition to blocking the diffusion of ions, can also block light from irradiating the second active layer, avoiding the effect of light on the performance of the second thin film transistor.

Furthermore, the orthographic projections of the electrodes of the second thin film transistors onto the base substrate all fall within the orthographic projection of the first barrier layer onto the base substrate, the orthographic projections of the electrodes of the second thin film transistors onto the base substrate all fall within the orthographic projection of the second barrier layer onto the base substrate. The electrodes of the thin film transistors are generally made of metal and can reflect light. If external light or light emitted by the display substrate itself is reflected by the electrodes of the second thin film transistor and irradiates the second active layer, the performance of the second thin film transistor will be affected, and after the electrodes of the second thin film transistor are blocked by the second barrier layer and the first barrier layer, the case that light is reflected by the electrodes of the second thin film transistor and irradiates the second active layer can be avoided, thus further ensuring he performance of the second thin film transistor.

In some embodiments, the orthographic projection of the first active layer onto the base substrate at least partially overlaps the orthographic projection of the first barrier layer onto the base substrate, and the orthographic projection of the first active layer onto the base substrate at least partially overlaps the orthographic projection of the second barrier layer onto the base substrate.

The first active layer is made of low-temperature polysilicon and is not affected by hydrogen ions and other ions; therefore, the first barrier layer and the second barrier layer may not block the first active layer, and of course, the first barrier layer and the second barrier layer may also be designed as an integral layer structure, so that the pattern of the first barrier layer and the second barrier layer does not need to be formed through a patterning process. It is sufficient to directly form the integral layer of first barrier layer and the second barrier layer. If the first barrier layer and the second barrier layer do not block the first active layer, the pattern of the first barrier layer and the second barrier layer needs to be formed through a patterning process.

The electrodes of the thin film transistor are generally made of metal, and can reflect light; if external light or light emitted by the display substrate itself is reflected by the electrodes of the first thin film transistor and irradiates the second active layer, the performance of the second thin film transistor will be affected; and if the electrodes of the first thin film transistor are blocked by the second barrier layer and the first barrier layer, the case that light is reflected by the electrodes of the first thin film transistor and irradiates the second active layer can be avoided, thus further ensuring he performance of the second thin film transistor. Therefore, the orthographic projections of the electrodes of the first thin film transistor onto the base substrate at least partially overlap the orthographic projection of the first barrier layer onto the base substrate, and the orthographic projections of the electrodes of the first thin film transistor onto the base substrate at least partially overlap the orthographic projection of the second barrier layer onto the base substrate.

In some embodiments, the display substrate further comprises a silicon nitride layer on a side of the first barrier layer close to the base substrate; and/or a silicon nitride layer on a side of the second barrier layer away from the base substrate.

In a display substrate, a silicon nitride layer is often used as an inorganic insulation layer, for example, as a gate insulation layer and an interlayer insulation layer; hydrogen ions are included in the silicon nitride layer; in order to avoid the hydrogen ions in the silicon nitride layer diffusing into a second active layer after a hydrogenation process, a first barrier layer and/or a second barrier layer are provided between the second active layer and the silicon nitride layer. Hydrogen ions in the silicon nitride layer are blocked from diffusing into the second active layer, ensuring the performance of the second thin film transistor.

In some embodiments, the first barrier layer and the second barrier layer may is made of a metal oxide, which has high compactness and can effectively block hydrogen ions or other ions in other film layers from diffusing into the second active layer.

In some embodiments, the first barrier layer and the second barrier layer is made of molybdenum oxide or molybdenum oxide added with a metal including neodymium and tantalum. Thus, the barrier layer is a ferrous metal oxide, on the one hand, capable of blocking hydrogen ions or other ions in other film layers from diffusing into the second active layer, and on the other hand, capable of preventing external light from irradiating the second active layer, so as to further ensure the performance of the second thin film transistor and optimize the electrical reliability of the second thin film transistor. Furthermore, the etching process of the barrier layer is well matched with that of the inorganic dielectric layer, and the barrier layer is a large resistance material, and no additional potential is needed to control interference such as parasitic capacitance.

In some embodiments, the first barrier layer and the second barrier layer may have a thickness of 10-100 nm. When the above-mentioned values are adopted for the thickness of the barrier layer, the influence on the thickness of the display substrate is small, and in addition, hydrogen ions or other ions in other film layers can be effectively blocked from diffusing into the second active layer.

In this embodiment, a metal oxide semiconductor material such as IGZO, IZO and ZnO can be used as the second active layer, and the thickness can be 40-60 nm.

In some embodiments, a hydrogenation process is performed on the display substrate after the second active layer is formed, so that hydrogen ions in the inorganic insulation layer or the organic insulation layer diffuse into the first active layer, the first active layer is supplemented with hydrogen, the defects are passivated, and the electrical stability of the first active layer is improved. To ensure that hydrogen ions can diffuse into the first active layer, the orthographic projection of the first active layer onto the base substrate does not overlap the orthographic projection of the first barrier layer onto the base substrate, and the orthographic projection of the first active layer onto the base substrate does not overlap the orthographic projection of the second barrier layer onto the base substrate. Thus the first barrier layer and the second barrier layer do not block hydrogen ions from diffusing into the first active layer.

In a specific embodiment, as shown in FIG. 1, the display substrate comprises the following provided sequentially in a direction away from the base substrate 01:
- a first buffer layer 02;
- the first active layer 03 comprising a first source drain contact region 031;
- a first gate insulation layer 04 of the first thin film transistor;
- a first gate electrode 06 of the first thin film transistor;
- a second gate insulation layer 05 of the first thin film transistor;
- a second buffer layer 08;
- the second active layer 09 comprising a second source drain contact region 091;
- a third gate insulation layer 10 of the second thin film transistor;
- a second gate electrode 11 of the second thin film transistor;
- a first interlayer insulation layer 13;
- a first source electrode 141 and a first drain electrode 142 of the first thin film transistor and a second source electrode 151 and a second drain electrode 152 of the second thin film transistor, wherein the first source electrode 141 and the first drain electrode 142 are respectively connected to the first source/drain contact region 031 of the first active layer through a via hole penetrating the first gate insulation layer, the second gate insulation layer, the first barrier layer, the second buffer layer, the third gate insulation layer and the second barrier layer and the first interlayer insulation layer, and the second source electrode 151 and the second drain electrode 152 are respectively connected to the second source/drain contact region 091 of the second active layer through a via hole penetrating the third gate insulation layer, the second barrier layer and the first interlayer insulation layer;

a passivation layer 16;

a planarization layer 17;

wherein the first barrier layer 07 is located between the second buffer layer 08 and the second gate insulation layer 05; the second barrier layer 12 is located between the first interlayer insulation layer 13 and the second gate electrode 11.

In this embodiment, the second gate insulation layer 05 may be made of silicon nitride, and in order to prevent hydrogen ions from diffusing into the second active layer 09 due to the presence of hydrogen ions in the second gate insulation layer 05, a first barrier layer 07 is provided between the second gate insulation layer 05 and the second active layer 09; the first interlayer insulation layer 13 may be made of silicon oxide; in order to avoid the diffusion of hydrogen ions in the first interlayer insulation layer 13 and the passivation layer 16 and the planarization layer 17 into the second active layer 09, a second barrier layer 12 is provided between the first interlayer insulation layer 13 and the second active layer 09.

Figure 2:
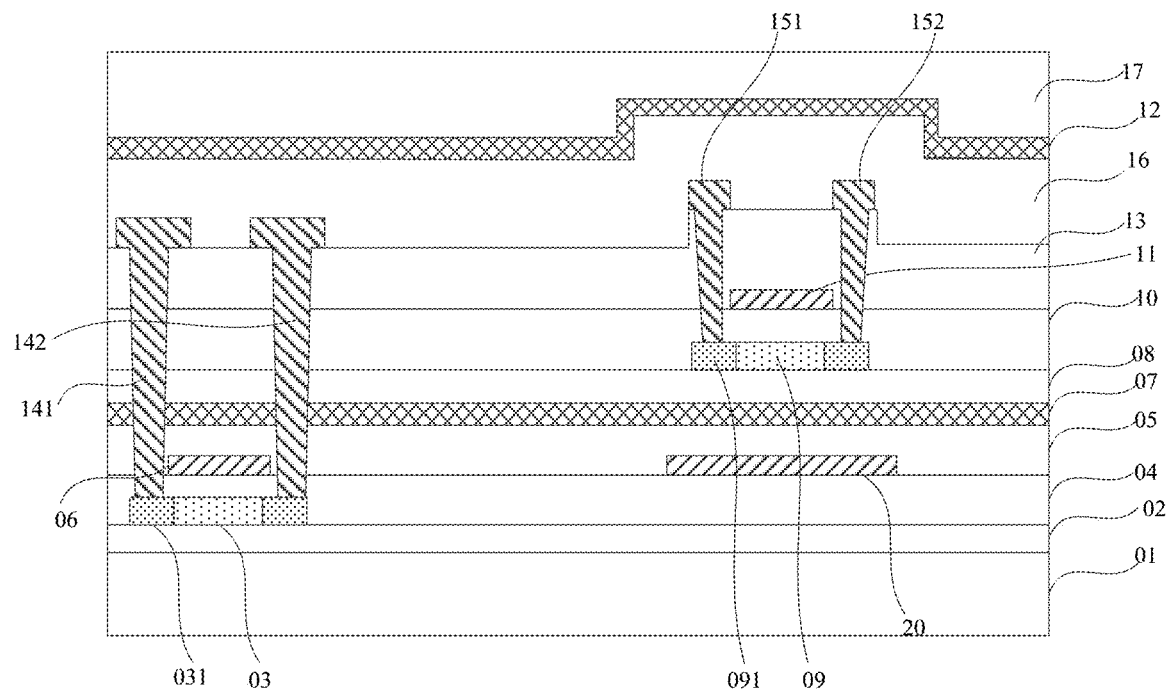

In another specific embodiment, as shown in FIG. 2, the display substrate comprises the following provided sequentially in a direction away from the base substrate 01:

a first buffer layer 02;

the first active layer 03 comprising a first source drain contact region 031;

a first gate insulation layer 04 of the first thin film transistor;

a first gate electrode 06 of the first thin film transistor;

a second gate insulation layer 05 of the first thin film transistor;

a second buffer layer 08;

the second active layer 09 comprising a second source drain contact region 091;

a third gate insulation layer 10 of the second thin film transistor;

a second gate electrode 11 of the second thin film transistor;

a first interlayer insulation layer 13;

a first source electrode 141 and a first drain electrode 142 of the first thin film transistor and a second source electrode 151 and a second drain electrode 152 of the second thin film transistor, wherein the first source electrode and the first drain electrode are respectively connected to the first source/drain contact region 031 of the first active layer through a via hole penetrating the first gate insulation layer, the second gate insulation layer, the first barrier layer, the second buffer layer, the third gate insulation layer and the first interlayer insulation layer, and the second source electrode and the second drain electrode are respectively connected to the second source/drain contact region 091 of the second active layer through a via hole penetrating the third gate insulation layer and the first interlayer insulation layer;

a passivation layer 16;

a planarization layer 17;

wherein the first barrier layer 07 is located between the second buffer layer 08 and the second gate insulation layer 05; the second barrier layer 12 is located between the passivation layer 16 and the planarization layer 17.

In this embodiment, the second gate insulation layer 05 may be made of silicon nitride, and in order to prevent hydrogen ions from diffusing into the second active layer 09 due to the presence of hydrogen ions in the second gate insulation layer 05, a first barrier layer 07 is provided between the second gate insulation layer 05 and the second active layer 09; in order to prevent hydrogen ions in the planarization layer 17 from diffusing into the second active layer 09, a second barrier layer 12 is provided between the planarization layer 17 and the second active layer 09.

Figure 3:
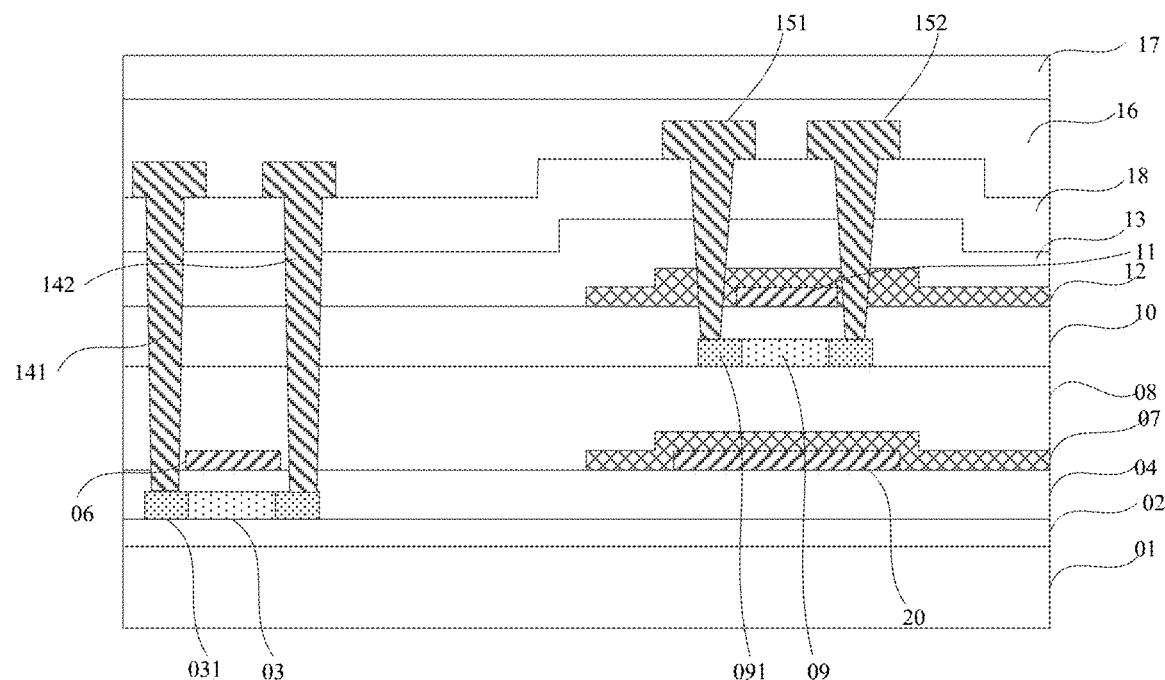

In another specific embodiment, as shown in FIG. 3, the display substrate comprises the following provided sequentially in a direction away from the base substrate 01:

a first buffer layer 02;

the first active layer 03 comprising a first source drain contact region 031;

a first gate insulation layer 04 of the first thin film transistor;

a first gate electrode 06 of the first thin film transistor;

a second buffer layer 08;

the second active layer 09 comprising a second source drain contact region 091;

a third gate insulation layer 10 of the second thin film transistor;

a second gate electrode 11 of the second thin film transistor;

a first interlayer insulation layer 13;

a second interlayer insulation layer 18;

a first source electrode 141 and a first drain electrode 142 of the first thin film transistor and a second source electrode 151 and a second drain electrode 152 of the second thin film transistor, wherein the first source electrode and the first drain electrode are respectively connected to the first source/drain contact region 031 of the first active layer through a via hole penetrating the first gate insulation layer, the second buffer layer, the third gate insulation layer, the first interlayer insulation layer and the second interlayer insulation layer, and the second source electrode and the second drain electrode are respectively connected to the second source/drain contact region 091 of the second active layer through a via hole penetrating the third gate insulation layer, the first interlayer insulation layer and the second interlayer insulation layer;

wherein the first barrier layer 07 is located between the first gate electrode 06 and the second buffer layer 08; the second barrier layer 12 is located between the second gate electrode 11 and the first interlayer insulation layer 13.

In this embodiment, the second gate insulation layer 04 may be made of silicon nitride, and in order to prevent hydrogen ions from diffusing into the second active layer 09 due to the presence of hydrogen ions in the first gate insulation layer 04, a first barrier layer 07 is provided between the first gate insulation layer 04 and the second active layer 09; the first interlayer insulation layer 13 may be made of silicon oxide; in order to avoid the diffusion of hydrogen ions in the first interlayer insulation layer 13 and the passivation layer 16 and the planarization layer 17 into the second active layer 09, a second barrier layer 12 is provided between the first interlayer insulation layer 13 and the second active layer 09.

Figure 4:
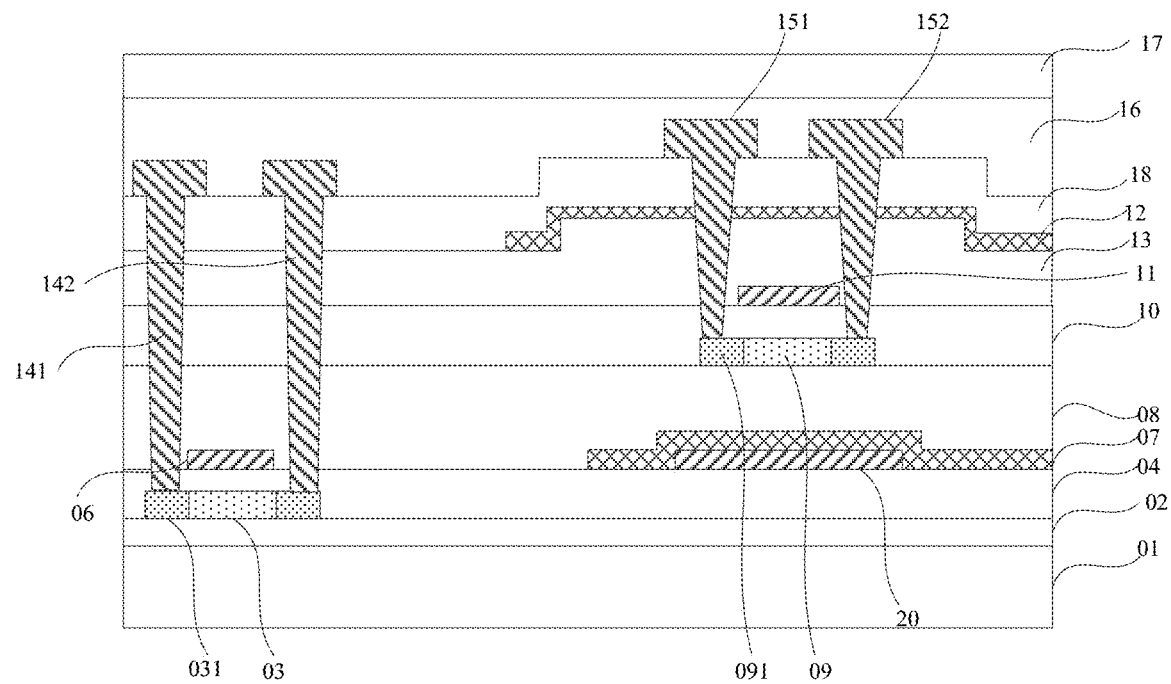

In another specific embodiment, as shown in FIG. 4, the display substrate comprises the following provided sequentially in a direction away from the base substrate 01:

a first buffer layer 02;

the first active layer 03 comprising a first source drain contact region 031;
a first gate insulation layer 04 of the first thin film transistor;
a first gate electrode 06 of the first thin film transistor;
a second buffer layer 08;
the second active layer 09 comprising a second source drain contact region 091;
a third gate insulation layer 10 of the second thin film transistor;
a second gate electrode 11 of the second thin film transistor;
a first interlayer insulation layer 13;
a second interlayer insulation layer 18;
a first source electrode 141 and a first drain electrode 142 of the first thin film transistor and a second source electrode 151 and a second drain electrode 152 of the second thin film transistor, wherein the first source electrode and the first drain electrode are respectively connected to the first source/drain contact region 031 of the first active layer through a via hole penetrating the first gate insulation layer, the second buffer layer, the third gate insulation layer, the first interlayer insulation layer and the second interlayer insulation layer, and the second source electrode and the second drain electrode are respectively connected to the second source/drain contact region 091 of the second active layer through a via hole penetrating the third gate insulation layer, the first interlayer insulation layer and the second interlayer insulation layer;
wherein the first barrier layer 07 is located between the first gate electrode 06 and the second buffer layer 08; the second barrier layer 12 is located between the second interlayer insulation layer 18 and the first interlayer insulation layer 13.

In this embodiment, the second gate insulation layer 04 may be made of silicon nitride, and in order to prevent hydrogen ions from diffusing into the second active layer 09 due to the presence of hydrogen ions in the first gate insulation layer 04, a first barrier layer 07 is provided between the first gate insulation layer 04 and the second active layer 09; the second interlayer insulation layer 18 may be made of silicon nitride; in order to avoid the diffusion of hydrogen ions in the second interlayer insulation layer 18 and the passivation layer 16 and the planarization layer 17 into the second active layer 09, a second barrier layer 12 is provided between the second interlayer insulation layer 18 and the second active layer 09.

In some embodiment, as shown in FIG. 1-4, a bottom gate 20 of the second thin film transistor may be provided in a same layer, and formed with the same material as the first gate electrode 06 of the first thin film transistor. The bottom gate 20 of the second thin film transistor can be electrically connected to the second gate electrode 11 of the second thin film transistor, and can be used as a bottom gate electrode of the second thin film transistor (double gate structure). As a result, the On-current of the oxide transistor can be further increased.

Moreover, as a light-shielding layer, the bottom gate 20 overlaps with the orthographic projection of the active layer of the upper Oxide transistor on the substrate, so it is possible to suppress degradation of characteristics of the oxide semiconductor layer caused by light from the substrate side (backlight light). The bottom gate 20 may be in a floating state.

In this embodiment, the electrodes of the thin film transistor, such as the first source electrode 141, the first drain electrode 142, the second gate electrode 11, the second source electrode 151, the second drain electrode 152 and the first gate electrode 06, can use a metal material such as Mo or Al, and the thickness can be 200-1000 nm.

In some embodiments, the first gate insulation layer 04 may be made of silicon oxide and the second gate insulation layer 05 may be made of silicon nitride doped with hydrogen ions to provide hydrogen ions required for the hydrogenation process. The thickness of the first gate insulation layer 04 may be 100-200 nm, and the thickness of the second gate insulation layer 05 may be 100-200 nm.

In some embodiments, the first interlayer insulation layer 13 is made of silicon oxide and the second interlayer insulation layer 18 is made of a composite of silicon oxide and silicon nitride doped with hydrogen ions to provide the hydrogen ions required for the hydrogenation process. The thickness of the first interlayer insulation layer 13 may be 100-500 nm, and the thickness of the second interlayer insulation layer 18 may be 100-500 nm.

The above embodiment is described with the thin film transistor including one gate electrode. However, the thin film transistor is not limited to include only one gate electrode, but may include two gate electrodes.

Embodiments of the present disclosure also provide a display device which comprises the display substrate described above.

The display device may be any product or component with a display function, such as a television, a display, a digital photo frame, a mobile phone, a tablet computer, wherein the display device further comprises a flexible circuit board, a printed circuit board and a backboard.

The display device includes, but is not limited to: a radio frequency unit, a network module, an audio output unit, an input unit, a sensor, a display unit, a user input unit, an interface unit, a memory, a processor, and a power supply, etc. It will be appreciated by those skilled in the art that the configuration of the display device described above is not intended to be limiting and that the display device may include more or fewer of the components described above, or some combinations of the components, or different arrangements of the components. In embodiments of the present disclosure, display devices include, but are not limited to, displays, mobile phones, tablet computers, televisions, wearable electronics, navigation display apparatus, and the like.

Embodiments of the present disclosure also provide a manufacturing method of a display substrate, the display substrate comprising a base substrate, and a first thin film transistor and a second thin film transistor formed on the base substrate, wherein a first active layer of the first thin film transistor is made of low-temperature polysilicon, a second active layer of the second thin film transistor is made of metal oxide, and the manufacturing method of a display substrate comprises the following steps:
 a first barrier layer is formed on a side of the second active layer close to the base substrate;
 a second barrier layer is formed on a side of the second active layer away from the base substrate;
 wherein the orthographic projection of the second active layer onto the base substrate falls within the orthographic projection of the first barrier layer onto the base substrate, and the orthographic projection of the second active layer onto the base substrate falls within the orthographic projection of the second barrier layer onto the base substrate. The orthographic projections of the electrodes of the second thin film transistor onto the base substrate all falls within the orthographic projection of the first barrier layer onto the base substrate, and the orthographic projections of the electrodes of the second thin film transistor onto the base substrate all falls within the orthographic projection of the second barrier layer onto the base substrate.

In this embodiment, barrier layers (comprising a first barrier layer and a second barrier layer) are formed on the upper and lower sides of the second active layer, wherein the barrier layers can block hydrogen ions or other ions in other film layers from diffusing into the second active layer, avoid electrical problems such as threshold voltage shift in the second active layer, improve the electrical stability of the second thin film transistor, and thus improve the electrical reliability of the display substrate.

In the film layers of the display substrate, hydrogen ions and other ions may be present in the inorganic insulation layer and the organic insulation layer, and hydrogen ions in these film layers may diffuse after the display substrate is subjected to a hydrogenation process, and the diffusion of hydrogen ions may affect the negative bias temperature stress (NBTS) characteristic of the second thin film transistor. For example, hydrogen ions may generate additional hole carriers after diffusing into the channel of the second active layer; after the hydrogen ions diffuse to the interface of the second active layer and the gate insulation layer, a defect energy level is generated, and the defect energy level functions as a hole trap at the interface; when a negative gate bias is applied, hole trapping occurs on the hole carriers at the interface of the second active layer and the gate insulation layer, partially shielding the gate electric field, and negatively biasing the threshold voltage (Vth). In order to avoid this, in the present embodiment, barrier layers (comprising a first barrier layer and a second barrier layer) are provided on the upper and lower sides of the second active layer, and the barrier layers can block hydrogen ions or other ions in other film layers from diffusing into the second active layer, ensuring the performance of the second thin film transistor.

In some embodiments, the first barrier layer and/or the second barrier layer are made of a light absorbing material, so that the first barrier layer and the second barrier layer, in addition to blocking the diffusion of ions, can also block light from irradiating the second active layer, avoiding the effect of light on the performance of the second thin film transistor.

Furthermore, the orthographic projections of the electrodes of the second thin film transistors onto the base substrate all fall within the orthographic projection of the first barrier layer onto the base substrate, the orthographic projections of the electrodes of the second thin film transistors onto the base substrate all fall within the orthographic projection of the second barrier layer onto the base substrate. The electrodes of the thin film transistors are generally made of metal and can reflect light. If external light or light emitted by the display substrate itself is reflected by the electrodes of the second thin film transistor and irradiates the second active layer, the performance of the second thin film transistor will be affected, and after the electrodes of the second thin film transistor are blocked by the second barrier layer and the first barrier layer, the case that light is reflected by the electrodes of the second thin film transistor and irradiates the second active layer can be avoided, thus further ensuring he performance of the second thin film transistor.

In some embodiments, the orthographic projection of the first active layer onto the base substrate at least partially overlaps the orthographic projection of the first barrier layer onto the base substrate, and the orthographic projection of the first active layer onto the base substrate at least partially overlaps the orthographic projection of the second barrier layer onto the base substrate.

The first active layer is made of low-temperature polysilicon and is not affected by hydrogen ions and other ions; therefore, the first barrier layer and the second barrier layer may not block the first active layer, and of course, the first barrier layer and the second barrier layer may also be designed as an integral layer structure, so that the pattern of the first barrier layer and the second barrier layer does not need to be formed through a patterning process. It is sufficient to directly form the integral layer of first barrier layer and the second barrier layer. If the first barrier layer and the second barrier layer do not block the first active layer, the pattern of the first barrier layer and the second barrier layer needs to be formed through a patterning process.

The electrodes of the thin film transistor are generally made of metal, and can reflect light; if external light or light emitted by the display substrate itself is reflected by the electrodes of the first thin film transistor and irradiates the second active layer, the performance of the second thin film transistor will be affected; and if the electrodes of the first thin film transistor are blocked by the second barrier layer and the first barrier layer, the case that light is reflected by the electrodes of the first thin film transistor and irradiates the second active layer can be avoided, thus further ensuring he performance of the second thin film transistor. Therefore, the orthographic projections of the electrodes of the first thin film transistor onto the base substrate at least partially overlap the orthographic projection of the first barrier layer onto the base substrate, and the orthographic projections of the electrodes of the first thin film transistor onto the base substrate at least partially overlap the orthographic projection of the second barrier layer onto the base substrate.

In some embodiments, the first barrier layer and the second barrier layer can be made of a metal oxide, which has a high density and can effectively block hydrogen ions or other ions in other film layers from diffusing into the second active layer.

In some embodiments, the first barrier layer and the second barrier layer are made of molybdenum oxide or molybdenum oxide added with a metal including neodymium and tantalum. Thus, the barrier layer is a ferrous metal oxide, on the one hand, capable of blocking hydrogen ions or other ions in other film layers from diffusing into the second active layer, and on the other hand, capable of preventing external light from irradiating the second active layer, so as to further ensure the performance of the second thin film transistor and optimize the electrical reliability of the second thin film transistor. Furthermore, the etching process of the barrier layer is well matched with that of the inorganic dielectric layer, and the barrier layer is a large resistance material, and no additional potential is needed to control interference such as parasitic capacitance.

In some embodiments, the orthographic projection of the first active layer onto the base substrate does not overlap the orthographic projection of the first barrier layer onto the base substrate, the orthographic projection of the first active layer onto the base substrate does not overlap the orthographic projection of the second barrier layer onto the base substrate, and the fabrication method further comprises the following step:

after forming the second barrier layer, the display substrate is subjected to a hydrogenation process.

In this embodiment, a hydrogenation process is performed on the display substrate after the second barrier layer is formed, so that hydrogen ions in the inorganic insulation layer or the organic insulation layer diffuse into the first active layer, the first active layer is supplemented with hydrogen, the defects are passivated, and the electrical stability of the first active layer is improved. To ensure that hydrogen ions can diffuse into the first active layer, the orthographic projection of the first active layer onto the base substrate does not overlap the orthographic projection of the first barrier layer onto the base substrate, and the orthographic projection of the first active layer onto the base substrate does not overlap the orthographic projection of the second barrier layer onto the base substrate. Thus the first barrier layer and the second barrier layer do not block hydrogen ions from diffusing into the first active layer.

Each film layer in the display substrate of the present embodiment can be prepared by deposition, exposure, etching, etc. Deposition can include, among others, sputtering and chemical vapor deposition, and etching can include dry etching and wet etching.

It should be noted that the various embodiments described herein are described in a progressive manner with reference to the same or similar parts throughout the various embodiments, with each embodiment focusing on differences from the other embodiments. In particular, the embodiments are described more simply because they are substantially similar to the product embodiments, to which reference is now made.

Unless defined otherwise, technical or scientific terms used in this disclosure shall have the ordinary meaning as understood by one of ordinary skill in the art to which this disclosure belongs. As used in this disclosure, the terms "first", "second" and the like do not denote any order, quantity, or importance, but rather are used to distinguish one element from another. The word "include/comprise" or "contain" or the like, means that the element or component preceded by the word is inclusive of the element or component listed after the word and its equivalents, and does not exclude other elements or components. Similar terms such as "connect" or "join" are not limited to physical or mechanical connections, but may include electrical connections, whether direct or indirect. "Upper", "lower", "left", "right" and the like are used merely to denote relative positional relationships, which may change accordingly when the absolute position of the subject being described changes.

It can be understood that when an element such as a layer, film, region or substrate is referred to as being "upper" or "lower" located on the other element, it can be "directly" "upper" or "lower" located on the other element or intervening elements may be present.

In the description of the embodiments above, particular features, structures, materials, or characteristics may be combined in any suitable manner in any one or more embodiments or examples.

The above embodiments are merely specific implementations of the present disclosure, but the scope of protection of the present disclosure is not limited thereto, and any modification and substitution being apparent to those skilled in the art without departing from the technical scope of the present disclosure shall be covered by the scope of protection of the present disclosure. Accordingly, the scope of protection of the present disclosure is as set forth in the claims.

What is claimed is:

1. A display substrate, comprising a base substrate, and a first thin film transistor and a second thin film transistor formed on the base substrate, wherein a first active layer of the first thin film transistor is made of low-temperature polysilicon, and a second active layer of the second thin film transistor is made of metal oxide, and the display substrate further comprises a first barrier layer on a side of the second active layer close to the base substrate and a second barrier layer on a side of the second active layer away from the base substrate, and an orthographic projection of the second active layer onto the base substrate falls within an orthographic projection of the first barrier layer onto the base substrate, the orthographic projection of the second active layer onto the base substrate falls within an orthographic projection of the second barrier layer onto the base substrate, and orthographic projections of electrodes of the second thin film transistor onto the base substrate all fall within the orthographic projection of the first barrier layer onto the base substrate and orthographic projections of electrodes of the second thin film transistors onto the base substrate all fall within the orthographic projection of the second barrier layer onto the base substrate;

wherein an orthographic projection of the first active layer onto the base substrate does not overlap the orthographic projection of the first barrier layer onto the base substrate, and the orthographic projection of the first active layer onto the base substrate does not overlap the orthographic projection of the second barrier layer onto the base substrate.

2. The display substrate of claim 1, wherein the first barrier layer and/or the second barrier layer are made of a light absorbing material.

3. The display substrate of claim 1, further comprising a silicon nitride layer on a side of the first barrier layer close to the base substrate; and/or a silicon nitride layer on a side of the second barrier layer away from the base substrate.

4. The display substrate of claim 1, wherein the display substrate comprises the following provided sequentially along a direction away from the base substrate:
a first buffer layer;
the first active layer;
a first gate insulation layer of the first thin film transistor;
a first gate electrode of the first thin film transistor;
a second buffer layer;
the second active layer;
a third gate insulation layer of the second thin film transistor;
a second gate electrode of the second thin film transistor;
a first interlayer insulation layer;
a second interlayer insulation layer;
a first source electrode and a first drain electrode of the first thin film transistor and a second source electrode and a second drain electrode of the second thin film transistor;
wherein the first barrier layer is located between the first gate electrode and the second buffer layer; the second barrier layer is located between the second gate electrode and the first interlayer insulation layer;
the first source electrode and the first drain electrode are respectively connected to the first active layer through a via hole penetrating the first gate insulation layer, the second buffer layer, the third gate insulation layer, the first interlayer insulation layer and the second interlayer insulation layer, and the second source electrode and the second drain electrode are respectively connected to the second active layer through a via hole penetrating the third gate insulation layer, the first interlayer insulation layer and the second interlayer insulation layer.

5. The display substrate of claim 1, wherein the display substrate comprises the following provided sequentially along a direction away from the base substrate:
- a first buffer layer;
- the first active layer;
- a first gate insulation layer of the first thin film transistor;
- a first gate electrode of the first thin film transistor;
- a second buffer layer;
- the second active layer;
- a third gate insulation layer of the second thin film transistor;
- a second gate electrode of the second thin film transistor;
- a first interlayer insulation layer;
- a second interlayer insulation layer;
- a first source electrode and a first drain electrode of the first thin film transistor and a second source electrode and a second drain electrode of the second thin film transistor;
- wherein the first barrier layer is located between the first gate electrode and the second buffer layer; the second barrier layer is located between the second interlayer insulation layer and the first interlayer insulation layer;
- the first source electrode and the first drain electrode are respectively connected to the first active layer through a via hole penetrating the first gate insulation layer, the second buffer layer, the third gate insulation layer, the first interlayer insulation layer and the second interlayer insulation layer, and the second source electrode and the second drain electrode are respectively connected to the second active layer through a via hole penetrating the third gate insulation layer, the first interlayer insulation layer and the second interlayer insulation layer.

6. The display substrate of claim 4, wherein the first interlayer insulation layer is made of silicon oxide and the second interlayer insulation layer is made of a composite of silicon oxide and silicon nitride doped with hydrogen ions.

7. The display substrate of claim 1, wherein the first barrier layer and the second barrier layer are made of a metal oxide.

8. The display substrate of claim 7, wherein the first barrier layer and the second barrier layer are made of molybdenum oxide or molybdenum oxide added with a metal including neodymium and tantalum.

9. The display substrate of claim 1, wherein the first barrier layer has a thickness of 10-100 nm and/or the second barrier layer has a thickness of 10-100 nm.

10. A display device, comprising the display substrate of claim 1.

11. A manufacturing method for manufacturing the display substrate according to claim 1, wherein a first active layer of the first thin film transistor is made of low-temperature polysilicon, a second active layer of the second thin film transistor is made of metal oxide, and the manufacturing method comprises the following steps:
- a first barrier layer is formed on a side of the second active layer close to the base substrate;
- a second barrier layer is formed on a side of the second active layer away from the base substrate;
- wherein an orthographic projection of the second active layer onto the base substrate falls within an orthographic projection of the first barrier layer onto the base substrate and the orthographic projection of the second active layer onto the base substrate falls within an orthographic projection of the second barrier layer onto the base substrate, and orthographic projections of electrodes of the second thin film transistor onto the base substrate all falls within the orthographic projection of the first barrier layer onto the base substrate and the orthographic projections of the electrodes of the second thin film transistor onto the base substrate all falls within the orthographic projection of the second barrier layer onto the base substrate.

12. The display substrate of claim 5, wherein the first interlayer insulation layer is made of silicon oxide and the second interlayer insulation layer is made of a composite of silicon oxide and silicon nitride doped with hydrogen ions.

* * * * *